(12) United States Patent
Signoff et al.

(10) Patent No.: US 8,957,733 B2
(45) Date of Patent: Feb. 17, 2015

(54) SYSTEMS AND METHODS FOR PERFORMING MULTI-MODAL POWER AMPLIFICATION

(71) Applicant: Marvell World Trade Ltd., St. Michael (BB)

(72) Inventors: David M. Signoff, Mountain View, CA (US); Shu-Hsien Liao, Sunnyvale, CA (US); Ming He, Fremont, CA (US); Wayne A. Loeb, San Francisco, CA (US)

(73) Assignee: Marvell World Trade Ltd., St. Michael (BB)

( * ) Notice: Subject to any disclaimer, the term of this patent is extended or adjusted under 35 U.S.C. 154(b) by 65 days.

(21) Appl. No.: 13/660,755

(22) Filed: Oct. 25, 2012

(65) Prior Publication Data

US 2013/0106507 A1    May 2, 2013

Related U.S. Application Data

(60) Provisional application No. 61/552,410, filed on Oct. 27, 2011.

(51) Int. Cl.
*H03F 3/68* (2006.01)
*H03F 1/56* (2006.01)
*H03F 1/02* (2006.01)
*H03F 1/22* (2006.01)
*H03F 3/72* (2006.01)

(52) U.S. Cl.
CPC ............. *H03F 1/56* (2013.01); *H03F 1/0277* (2013.01); *H03F 1/22* (2013.01); *H03F 3/72* (2013.01)
USPC ...................................... 330/295; 330/124 R (58) Field of Classification Search
USPC ................. 330/84, 126, 295, 124 R
See application file for complete search history.

(56) References Cited

U.S. PATENT DOCUMENTS

| | | | |
|---|---|---|---|
| 6,255,906 B1 | 7/2001 | Eidson et al. | |
| 6,301,467 B1 | 10/2001 | Jarvinen et al. | |
| 6,349,216 B1 * | 2/2002 | Alberth et al. | 455/550.1 |
| 6,556,814 B1 * | 4/2003 | Klomsdorf et al. | 455/121 |
| 7,113,033 B2 | 9/2006 | Barnett | |
| 7,944,296 B1 | 5/2011 | Lee et al. | |
| 7,982,543 B1 | 7/2011 | Yuan | |
| 7,994,296 B2 | 8/2011 | Shah | |
| 8,466,749 B2 * | 6/2013 | Ahn et al. | 330/311 |
| 2003/0199256 A1 | 10/2003 | Klomsdorf et al. | |
| 2004/0075494 A1 | 4/2004 | Klomsdorf et al. | |
| 2005/0030094 A1 | 2/2005 | Conrad et al. | |
| 2005/0206457 A1 * | 9/2005 | Martin et al. | 330/305 |
| 2006/0132232 A1 | 6/2006 | Baree et al. | |
| 2006/0178121 A1 | 8/2006 | Hamalainen et al. | |
| 2011/0025415 A1 | 2/2011 | Mu | |
| 2011/0070848 A1 | 3/2011 | Ramachandra Reddy | |
| 2011/0187451 A1 | 8/2011 | Yoon et al. | |

OTHER PUBLICATIONS

International Search Report and Written Report dated Mar. 21, 2013 in International Application No. PCT/US2012/061831.

* cited by examiner

*Primary Examiner* — Henry Choe (57) ABSTRACT

In accordance with an embodiment of the disclosure, systems and methods are provided for multi-modal power amplification. In certain implementations, an adjustable power amplifier amplifies an input signal, and the amount of amplification is varied based on the input signal. A variable impedance unit receives an amplified input signal, and the amount of load impedance at the variable impedance unit is varied based on the input signal.

16 Claims, 11 Drawing Sheets

SYSTEMS AND METHODS FOR PERFORMING MULTI-MODAL POWER AMPLIFICATION

CROSS REFERENCE TO RELATED APPLICATION

This application claims the benefit under 35 U.S.C. §119(e) of U.S. Provisional Application No. 61/552,410, filed on Oct. 27, 2011, which is incorporated herein by reference in its entirety.

FIELD OF USE

The present disclosure relates generally to power amplification systems and methods, and, more particularly, to systems and methods for performing efficient multi-modal power amplification.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure. The present disclosure relates generally to power amplification, and, more particularly, to performing efficient multi-modal power amplification in wireless communication systems.

Many systems adhere to one or more standards or protocols for transmission of data. The use of standards is particularly dominant in wireless communications systems, which use standards in many types of data transmission, such as Wi-Fi, Bluetooth, cellular, WiMAX, or LTE. Often, multiple standards exist for a single type of data transmission. As an example, IEEE 802.11 is a set of wireless standards used by wireless Local Area Networks and defines communication protocols using over-the-air modulation techniques. Different standards may use signals with different characteristics and may therefore have different power amplification requirements. As an example, the 802.11b standard employs a single data stream, while the 802.11g standard employs multiple frequency channels such that a data rate may have high peaks when a large number of the channels are being used. Thus, signals with lower peak to average ratios are suitable to be used in accordance with the 802.11b standard, while signals with higher peak to average ratios are suitable to be used in accordance with the 802.11g standard.

Sometimes, different devices, such as power amplifiers, are used to meet requirements of a system that uses different systems. For example, one device may be designated to be used when the system operates in accordance with the 802.11b standard, while a second device is used during operation in accordance with the 802.11g standard. It is costly and inefficient to have multiple devices, each device being used only a fraction of the time.

SUMMARY

In accordance with an embodiment of the disclosure, systems and methods are provided for multi-modal power amplification. In certain implementations, an adjustable power amplifier amplifies an input signal, and the amount of amplification is varied based on the input signal. A variable impedance unit receives an amplified input signal, and the amount of load impedance at the variable impedance unit is varied based on the input signal.

In certain implementations, the adjustable power amplifier comprises a first amplifier connected in parallel with a second amplifier. In certain implementations, the amount of amplification is varied by coupling a first gate terminal of the first amplifier to a first gate terminal of the second amplifier, such that both amplifiers become active, and coupling the first gate terminal of the second amplifier to ground, such that the second amplifier becomes inactive. In certain implementations, determining whether to couple the second gate terminal to the first gate terminal or to ground is based on a characteristic of the input signal. In certain implementations, the first and second amplifiers are cascode amplifiers.

In certain implementations, the variable impedance load unit includes an impedance device connected in parallel with a switch, wherein the impedance device includes at least one of a resistor, a capacitor, and an inductor. In certain implementations, a desired load impedance is determined based on a peak to average ratio of the input signal, and opening or closing the switch is based on the desired load impedance. In certain implementations, the switch includes an LDMOS transistor.

In certain implementations, the variable load impedance unit includes a transformer, and the amount of load impedance based on a transformation ratio of the transformer.

In certain implementations, the adjustable power amplifier and variable load impedance unit are part of a wireless communication system and operate in accordance with a number of IEEE 802.11 standards.

In certain implementations, a central processing unit (CPU) is configured to change the amount of amplification and change the amount of load impedance based on the input signal.

BRIEF DESCRIPTION OF THE DRAWINGS

The above and other features of the present disclosure, including its nature and its various advantages, will be more apparent upon consideration of the following detailed description, taken in conjunction with the accompanying drawings in which.

DETAILED DESCRIPTION

To provide an overall understanding of the present disclosure, certain illustrative embodiments will now be described, including a circuit for a multi-modal power amplification system. However, it will be understood by one of ordinary skill in the art that systems and methods described herein may be adapted and modified as appropriate for the application being addressed and that the systems and methods described herein may be employed in other suitable applications, and that such other additions and modifications will not depart from the scope of the present disclosure.

For illustrative purposes, the systems and methods disclosed herein are described in relation to a wireless communications system operating in accordance with the IEEE 802.11b and 802.11g standards. In general, any standard may be used, such as any 802.11 standard for Wi-Fi data transmission. In addition, any standard used in LTE, WiMAX, Bluetooth, cellular, or any other wireless communication system may also be used in accordance with the systems and methods disclosed herein. Moreover, the present disclosure is also applicable to any system that uses power amplification and is not limited to wireless communication systems. One of ordinary skill in the art will appreciate that multi-modal power amplification systems such as those described herein are applicable to any number of standards in any number of applications that use power amplification.

Figure 1A:
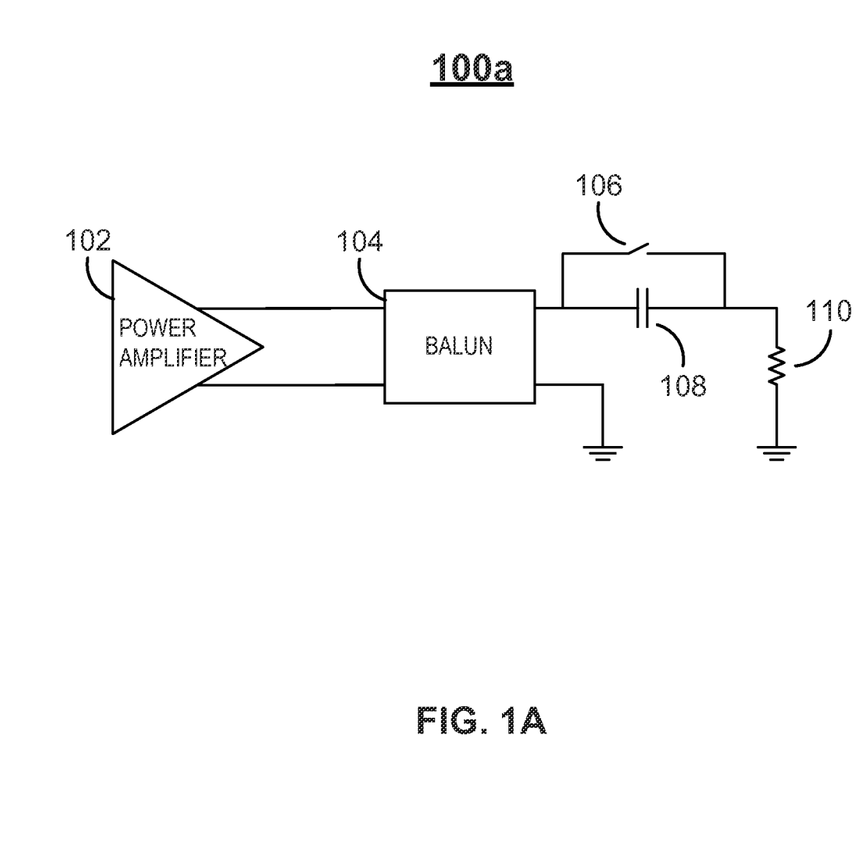
FIGS. 1A-1B show illustrative block diagrams of power amplification systems, in accordance with an embodiment of the disclosure.
Figure 1B:
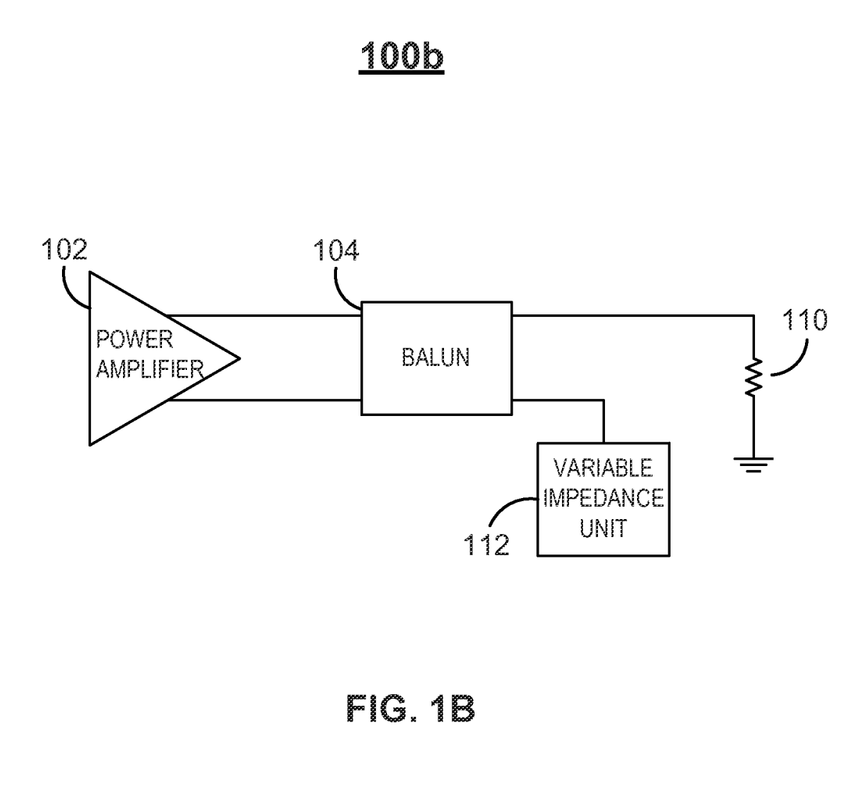

FIGS. 1A-1B show simplified diagrams of multi-modal power amplification systems 100a and 100b, in accordance with an illustrative embodiment of the present disclosure. Systems 100a and 100b may be used in accordance with multiple standards. In particular, parameters of the systems 100a and 100b may be set to predetermined values for operation in different modes. As an example, systems 100a or 100b may be included in a wireless communication system that uses multiple IEEE standards such as 802.11b and 802.11g. Systems 100a and 100b depict a single multi-modal power amplifier that can operate in multiple modes in accordance with different wireless communication standards. By avoiding use of two single-mode devices, systems 100a and 100b result in increased efficiency and lower costs.

System 100a includes a power amplifier 102, a balun 104, a switch 106, a capacitor 108, and a resistor 110. Resistor 110 may be an antenna in a wireless communications system. In certain implementations, resistor 110 is connected directly to power amplifier 102. However, often it is desirable to control an effective load impedance perceived by power amplifier 102. A combination of switch 106, capacitor 108, and balun 104 varies the effective load impedance perceived by power amplifier 102.

To operate system 100a in different modes, a size of the power amplifier 102 may be varied, and the effective load impedance of the circuit may be varied (i.e., by opening or closing switch 106). As will be described in more detail below, operation in one mode (i.e., 802.11b) may benefit by using a small device for power amplifier 102 and a large effective load impedance. In contrast, operation in another mode (i.e., 802.11g) may benefit by using a large device for power amplifier 102 and a small effective load impedance. Therefore, the size of power amplifier 102 and effective load impedance of system 100a may be varied accordingly for operation in different modes.

The size of power amplifier 102 is adjustable, and may be based on a characteristic of an input signal received by power amplifier 102, such as peak to average ratio of the input signal. By varying its size, power amplifier 102 provides variable amounts of amplification on the input signal. Power amplifier 102 may include multiple amplifiers. Depending on a desired size of power amplifier 102, only a certain number of the multiple amplifiers may become activated, while a remainder of the multiple amplifiers become deactivated. For example, when a large power amplifier 102 is desirable, a majority of the multiple amplifiers may become activated, while others may become inactivated. Similarly, when a small power amplifier 102 is desirable, a majority of the multiple amplifiers may become deactivated, leaving a minority of the multiple amplifiers to become activated. Activating or deactivating one or more amplifiers within power amplifier 102 may include flipping one or more switches or bits. A single power amplification unit with an adjustable size such as power amplifier 102 is desirable for providing savings in efficiency and cost. Example block diagrams of components within power amplifier 102 are described in more detail in relation to FIGS. 5 and 6.

Power amplifier 102 perceives an effective load impedance that includes a combination of balun 104, switch 106, capacitor 108, and resistor 110. Balun 104 receives an amplified signal from power amplifier 102 and transforms the amplified signal. In particular, balun 104 may be a transformer that may include two coupled inductors. One output port of balun 104 is coupled to ground, while another output port of balun 104 is coupled to switch 106, capacitor 108, and resistor 110. An example block diagram of components within balun 104 is described in more detail in relation to FIG. 3.

Resistor 110 is a load resistor, and in a wireless communications system, resistor 110 may correspond to an antenna. A resistance of a standard antenna is typically 50 ohms, such that a resistance of resistor 110 may be 50 ohms. As suggested above, a simple power amplification system may simply include a power amplifier coupled to an antenna. However, it may be undesirable for the power amplifier to perceive a fixed load impedance of 50 ohms. Therefore, according to the system and methods disclosed herein, the effective load impedance perceived by the power amplifier 102 is based on a transformation ratio of balun 104, a position of switch 106, and capacitor 108 in addition to resistor 110.

Switch 106 may be open or closed, and the position of switch 106 may be configured by setting a bit value. In particular, closing the switch effectively shorts out capacitor 108, such that no current travels through capacitor 108. In this case, closing the switch lowers the effective load impedance perceived by power amplifier 102, because the capacitor 108 is shorted out, and the effective load impedance is only dependent on balun 104 and resistor 110. In another example, opening the switch causes current to flow through capacitor 108, such that the effective load impedance perceived by power amplifier 102 is increased. As an example, if the resistance of resistor 110 is 50 ohms and the impedance of capacitor 108 is −50 j ohms. Because the impedance of a 50 ohm resistor in series with a −50 j ohm capacitor is equivalent to the impedance of a 100 ohm resistor in parallel with a −100 j ohm capacitor, this effectively results in a doubling of the impedance to 100 ohms. Therefore, opening or closing switch 106 increases or decreases the effective load impedance, respectively. In an example, an LDMOS transistor may be used as switch 106, or any other switch described herein.

Figure 8:
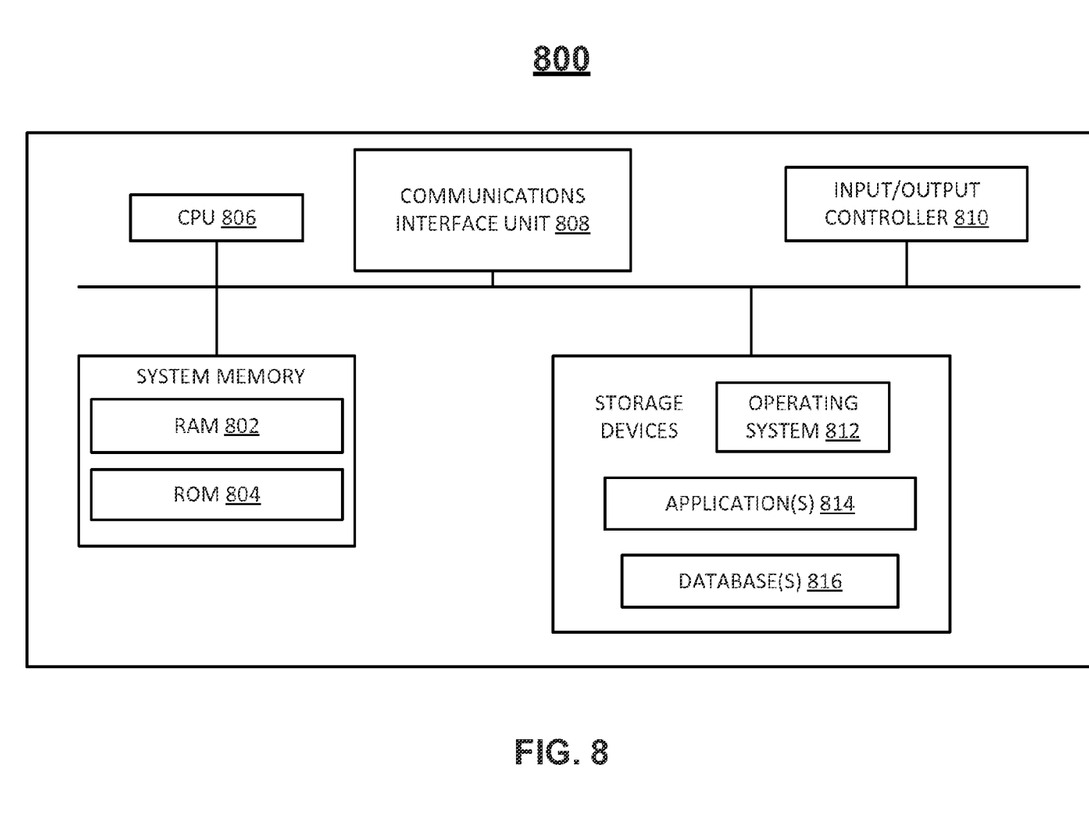
FIG. 8 shows an illustrative block diagram of a computing device, in accordance with an embodiment of the disclosure.

A computing device such as computing device 800, described in more detail in relation to FIG. 8, may be used to determine a desirable mode of operation for system 100a. In particular, computing device 800 may receive an input signal, and based on a feature or characteristic of the input signal, the computing device 800 may identify a desirable mode of operation. Then, based on the desired mode of operation, computing device 800 may configure or program opening and closing of switches in the systems described herein to achieve the desirable operational mode. As an example, upon determining that switch 106 (or any other switch described herein) should be closed, computing device 800 may transmit a signal to one or more terminals of switch 106. In particular, when the switch is implemented as a transistor, computing device 800 may transmit a voltage signal to a gate terminal of the transistor such that the switch is closed (i.e., such that current flows from source to drain terminals). In another example, upon determining that switch 106 (or any other switch described herein) should be open, computing device 800 may transmit a voltage signal to the transistor's gate terminal such that the switch is open (i.e., such that a small or negligible amount of current flows from the source to drain terminals).

System 100a may be used as a multi-mode power amplifier device in a wireless communication system. By appropriately adjusting the size of power amplifier 102 and adjusting the effective load impedance, system 100a is able to handle signals with large peaks, while also being efficient during transmission of signals with lower peaks. In particular, switches within power amplifier 102 and switch 106 may be configured to be open or closed based on the desired mode of operation.

In an example, system 100a may be used for operation in a mode corresponding to the 802.11b standard. In this case, it may be desirable to have a large value for the effective load impedance perceived by a small power amplifier 102. To achieve this, switch 106 may be opened, and switches within power amplifier 102 may be open or closed such that only a small portion of power amplifier 102 is activated, as described above and in relation to FIGS. 5 and 6.

In another example, system 100a may be used for operation in a mode corresponding to the 802.11g standard. In this case, it may be desirable to have a large value for the effective load impedance perceived by a large power amplifier 102. To achieve this, switch 106 may be closed, and switches within power amplifier 102 may be open or closed such that a large portion of power amplifier 102 is activated, as described above and in relation to FIGS. 5 and 6. By varying the sizes for power amplifier 102 and the effective load impedance, system 100a obtains good efficiency in both modes while being able to handle large peak to average ratios.

In another example, FIG. 1B shows a system 100b of a multi-modal power amplifier, in accordance with an illustrative embodiment of the present disclosure. Systems 100a and 100b are similar in that both systems include power amplifier 102, balun 104, and resistor 110. In contrast to system 100a, system 100b does not include switch 106 or capacitor 108 coupled to the top output port of balun 104. Instead, system 100b includes a variable impedance unit 112 coupled to a bottom output port of balun 104. Variable impedance unit 112 may have an equivalent effect on the system 100b as a combination of switch 106 and capacitor 108 in system 100a. In particular, computing device 800 may be configured to vary an effective impedance of variable impedance unit 112.

The position of variable impedance unit 112 at the bottom output port of balun 104 may be more desirable when compared to the configuration shown in FIG. 1A if it is undesirable to have two ungrounded nodes coupled by a switch. In particular, the two ungrounded nodes coupled by switch 106 may have large voltage swings. Thus, closing switch 106 may require complicated handling of different voltage swings on either side of switch 106. To avoid having to handle these large voltage swings, it may be desirable to position variable impedance unit 112 at the bottom output port of balun 104, where one side of a switch may be connected to ground, and smaller voltage swings are more likely. In particular, an LDMOS device is particularly suitable for a switch in variable impedance unit 112 because the drain terminal of an LDMOS transistor is configured to handle a large voltage swing.

The variable impedance unit 112 may take on any number of forms, including any number of resistors, capacitors, or inductors coupled in a variety of ways over switches. Various implementations of variable impedance unit 112 are shown and described in more detail in relation to FIGS. 2A-2C.

Figure 2A:
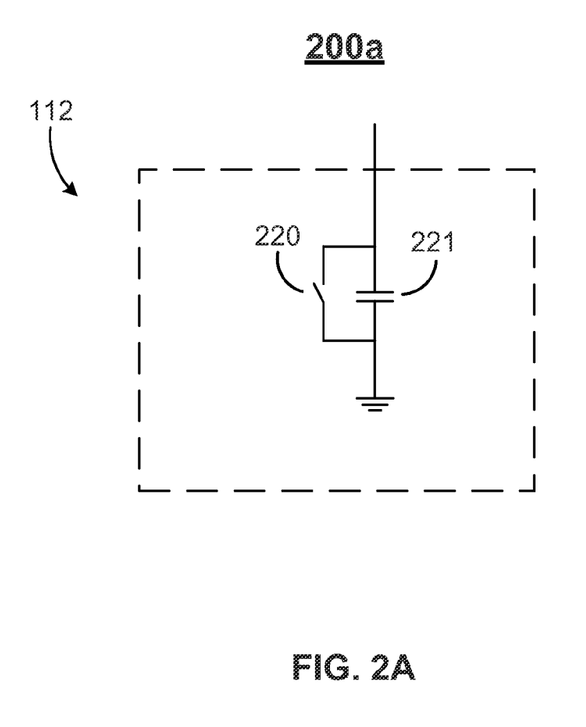
FIGS. 2A-2C show illustrative block diagrams of a variable impedance unit, in accordance with an embodiment of the disclosure.
Figure 2B:
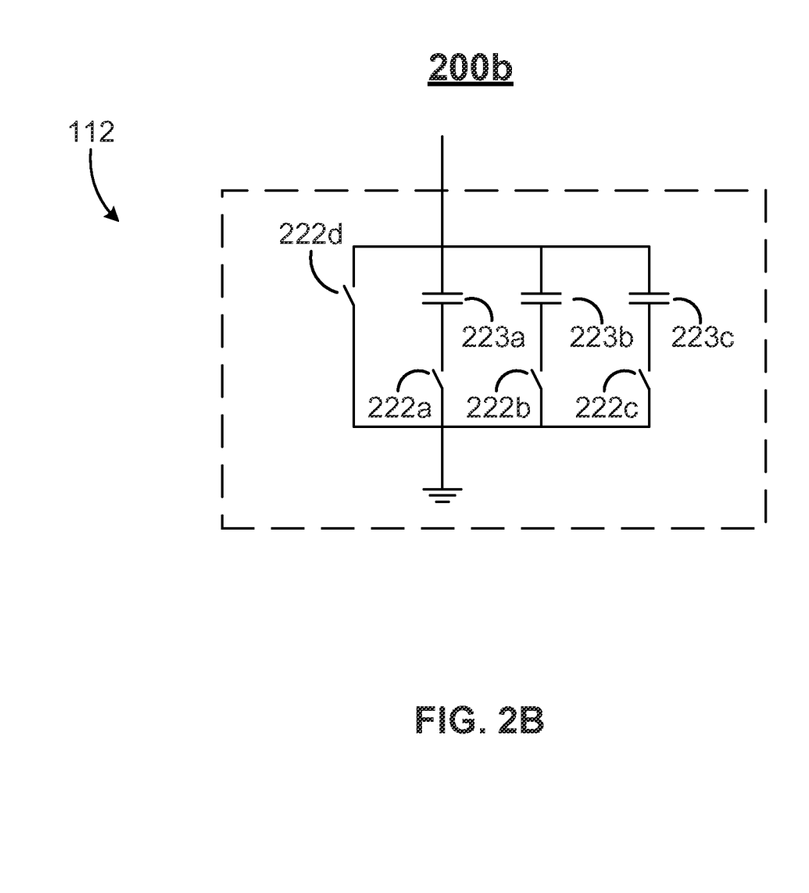
Figure 2C:
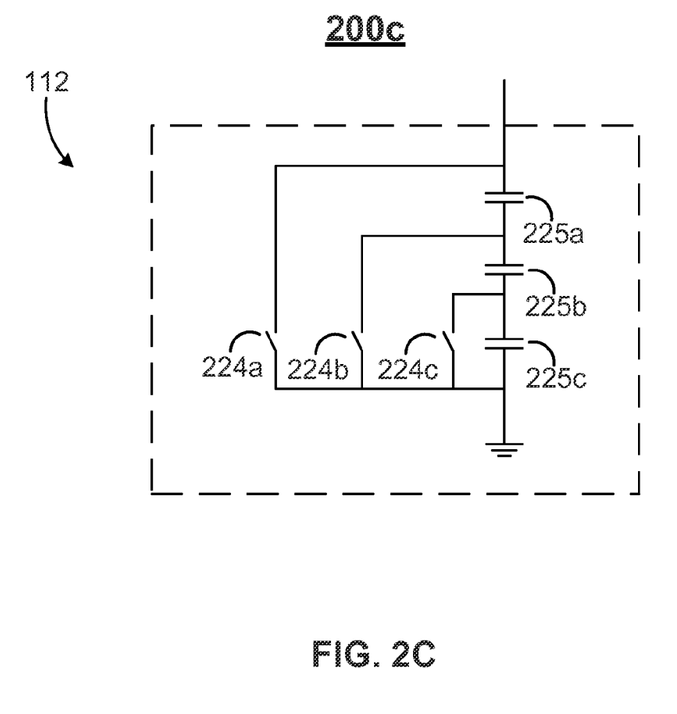

FIGS. 2A-2C are example circuit diagrams 200a-200c for variable impedance unit 112 in FIG. 1B, in accordance with an illustrative embodiment of the present disclosure. In particular, diagrams 200a-200c include switches which may be controlled by computing device 800. Diagram 200a includes a switch 220 and a capacitor 221 connected in parallel. In addition, one side of the switch 220 and the capacitor 221 is grounded. The other side is connected to one of the outputs of the balun 104 as depicted in FIG. 1B.

In an example, the resistance of the resistor 110 is 50 ohms and the impedance of the capacitor 221 is −50 j. Therefore, variable impedance unit 112 manipulates the effect load impedance following balun 104 by opening and closing switch 220. In particular, when switch 220 is closed, no current passes through capacitor 221 such that the effective load impedance following balun 104 simply corresponds to the resistance of the resistor 110, which is 50 ohms. In contrast, when the switch 220 is open, current passes through capacitor 221 such that the effective load impedance is the sum of the impedances of the resistor 110 and the capacitor 221 which is 50-50 j ohms. This impedance is equivalent to a 100 ohm resistor connected in parallel with a −100 ohm capacitor. Thus, opening switch 220 is equivalent to changing the effective load impedance to 100 ohms. Therefore, depending on whether a large load impedance or a small load impedance is desirable following balun 104, switch 220 may be open or closed. The example values for the resistance of resistor 110 (i.e., 50 ohms) and the impedance of the capacitor 221 (i.e., −50 j) are for illustrative purposes only, and one of ordinary skill in the art will appreciate that any value for the resistance of resistor 110 and for the impedance of capacitor 221 may be used without departing from the scope of the systems and methods disclosed herein.

A small load impedance may be desirable when a large device is used for adjustable power amplifier 102. In particular, a small load impedance allows the multi-mode power amplification system to remain linear up to higher levels of output power (compared to a large load impedance). Alternatively, a large load impedance may be desirable when a small device is used for adjustable power amplifier 102. In particular, a large load impedance may result in more nonlinearities at lower levels of output power (compared to a large load impedance). However, this is acceptable because the small device is used when the input signal has low peaks, such that linearity at high levels of output power is not required.

The examples in FIGS. 1A and 2A show circuit diagrams including a single switch 106 or 220. In these simple examples, a single switch is used to either include or not include a single capacitor 108 or 221. Additional switches and/or capacitors may be used to configure system 100b to have different load impedances. Examples of such systems are shown in diagrams 200b-200c.

Diagram 200b is another example of a circuit diagram for variable impedance unit 112 in FIG. 1B. In particular, diagram 200b includes three capacitors 223a-223c (generally, capacitor 223) and four switches 222a-222d (generally, switch 222). Each capacitor 223 is connected in series with a switch 222a-222c. In addition, switch 222d is connected in parallel with capacitors 223 and the remainder of the switches 222a-222c. In an example, closing switch 222d would effectively short out all the capacitors 223a-223c such that no current travels through any of these capacitors. Therefore, if a small load impedance is desirable in the system 100*b*, then switch 222*d* may be closed.

In another example, if the switch 222*d* is open, the switches 222*a*-222*c* may be either open or closed, depending on a desired valued for the effective impedance of system 100*b*. For example, if any two of the switches 222*a*-222*c* were open, then system 200*b* would exactly correspond to system 200*a*. However, it may be desirable to be able to couple multiple capacitors in parallel by closing two or more of the switches 222*a* through 222*c* to effectively vary the overall impedance of the system 100*b*. In particular, it may be desirable to have a multi-modal system that is configured to operate in any number of modes. In this case, it may be desirable to design variable impedance unit 112 to be configured to provide any number of impedances. For example, if the multi-modal power amplification system will be used in three different modes, it may be desirable to configure variable impedance unit 112 to provide three different impedances. Programming the opening and closing of switches such as switches 222*a*-222*d* changes a configuration of variable impedance unit 112 and enables different impedance values to be applied at different times.

Diagram 200*c* is another example of a circuit diagram for variable impedance unit 112. In particular, diagram 200*c* includes three capacitors 225*a* through 225*c* and three switches 224*a* through 224*c*. In an example, if the switch 224*a* is closed, this would mean that no current would travel through any of the capacitors 225*a* through 225*c* such that the overall impedance of the system 100*b* would correspond to exactly the resistance of the resistor 110. In another extreme, if all of the switches 224*a* though 224*c* were open, then the overall impedance of the system 200*c* would correspond to the sum of the impedances of the capacitors 225*a* through 225*c* because these three capacitors are connected in series. Alternatively, switches 224*a* through 224*c* may be open or closed to similarly vary the overall impedance of the system 200*c*. Therefore, by manipulating the switches in the illustrative diagrams shown in FIGS. 2*a*-2*c*, the variable impedance unit 112 is able to vary the effective impedance following the balun 104.

Figure 3:
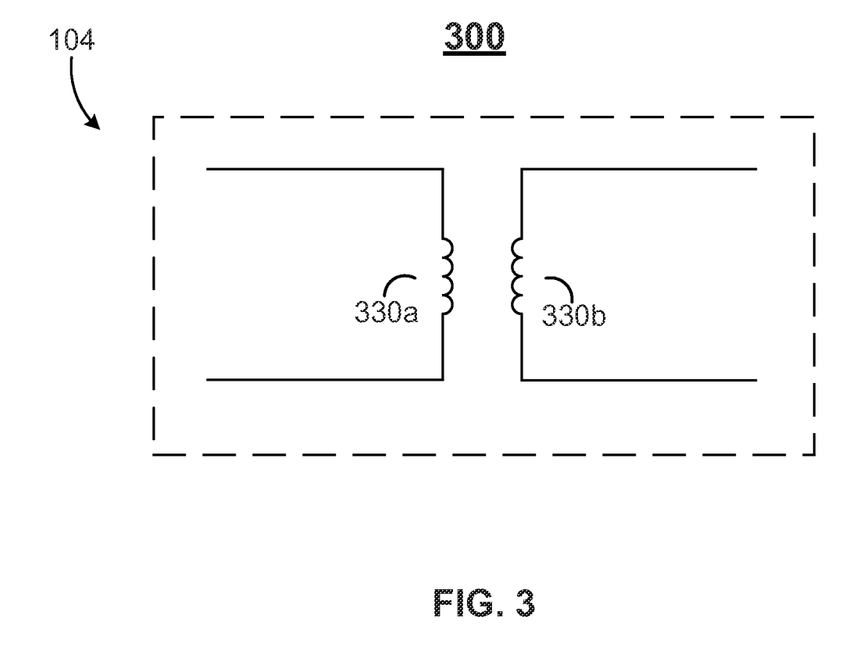
FIG. 3 shows an illustrative block diagram of a balun, in accordance with an embodiment of the disclosure.

FIG. 3 is an illustrative block diagram 300 of a balun 104, in accordance with an illustrative embodiment of the disclosure. A balun is an electrical device that converts electrical signals between a balanced signal and an unbalanced signal and may be used as an impedance transformer between two systems. The transformation ratio of balun 104 may therefore influence an amount of impedance perceived by power amplifier 102. Baluns are often used in peripheral applications such as in radio or any other type of communication system. As an example, resistor 110 may correspond to an antenna with a fixed resistance, and balun 104 is used to transform the effective impedance perceived by adjustable power amplifier 102. The example balun 104 shown in FIG. 3 may have any transformation ratio suitable for use in a power amplification system.

In an example, balun 104 includes two coupled inductors 330*a* and 330*b* as shown in FIG. 3. Inductors 330*a* and 330*b* are coupled such that when there is a current in one inductor, there is another current flow in the other inductor of equal magnitude but opposite phase. In balun 104, one pair of terminals (i.e., the input terminals on the left hand side connected to inductor 330*a*) is balanced, and the other pair of terminals (i.e., the output terminals on the right hand side connected to inductor 330*b*) is unbalanced. The output terminals are unbalanced because one port (i.e., the bottom port) may be connected to an electrical ground while the other port carries a signal. Thus, balun 104 serves as a converter between an unbalanced system and a balanced system, and may be used to connect an end device which handles unbalanced signals based on a ground potential (such as an antenna or resistor 110) and an integrated circuit which handles balanced signals (such as adjustable power amplifier 102). Balun 104 is particularly advantageous because parameters in either system (balanced or unbalanced) do not need to be changed before connecting them.

Figure 4:
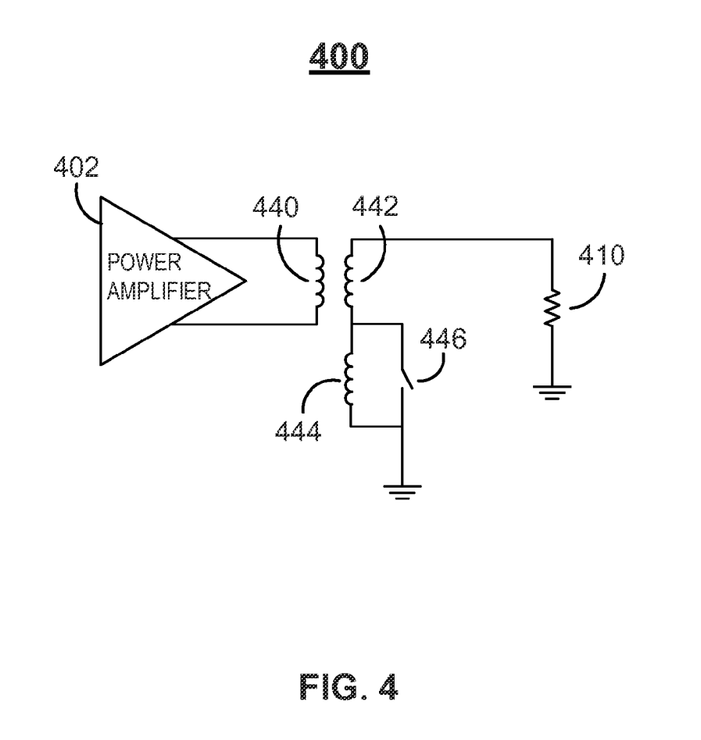
FIG. 4 shows an illustrative block diagram of a multi-mode power amplification system, in accordance with an embodiment of the disclosure.

FIG. 4 is an illustrative block diagram 400 of a multi-mode power amplification system, in accordance with an illustrative embodiment of the disclosure. Diagram 400 is similar to diagram 100*b* with variable impedance load unit 112 as shown in diagram 200*a*, except that an inductor 444 is used in place of capacitor 220. Diagram 400 includes a power amplifier 402, a pair of coupled inductors 440 and 442, a resistor 410, a third inductor 444, and a switch 446. In particular, power amplifier 402 may be adjustable and may correspond to the same adjustable power amplifier 102 as shown in FIGS. 1A and 1B. The coupled inductors 440 and 442 may correspond to a transformer (i.e., similar to balun 104), and the resistor 410 may correspond to the resistor 110. The diagram 400 further includes a variable impedance unit (i.e., including inductor 444 and switch 446) coupled to an output terminal of the transformer (i.e., bottom terminal of inductor 442). The inductances of inductors 440, 442, and 444 may be the same or different. As an example, the inductance of inductor 440 may be 1 nH, and the inductances of inductors 442 and 444 may be 0.5 nH.

Furthermore, the impedance of the variable impedance unit (i.e., inductor 444 and switch 446) may be varied by opening and closing switch 446. In particular, when the switch 446 is closed, inductor 444 is shorted out such that no current travels through inductor 444. In this case, the impedance of the variable impedance unit is zero, such that the effective load impedance is determined by the resistance of resistor 410 and the transformation ratio of the transformer. However, if switch 446 is open, current flows through inductor 444, such that the impedance of the variable impedance unit corresponds to the impedance of inductor 444. In this case, the effective load impedance is determined by the resistance of resistor 410, the inductance of inductor 444, and the transformation ratio of the transformer.

Therefore, the diagram 400 is another example of a multi-mode power amplifier that uses one or more inductors to vary the load impedance of the circuit. In addition, the diagram 400 is for illustrative purposes only, and one of ordinary skill in the art will understand that inductors and switches may be formed and added in parallel or in series appropriately in order to effectively vary the load impedance perceived by power amplifier 402. In addition, any number of capacitors (such as capacitors 221, 223 and 225), inductors (such as inductor 444), resistors (such as resistors 110 or 410), and/or switches (such as switches 220, 222, 224, and 446) may be combined in any number of configurations (such as using parallel and/or series connections) in order to achieve a desirable value for an effective load impedance.

Figure 5:
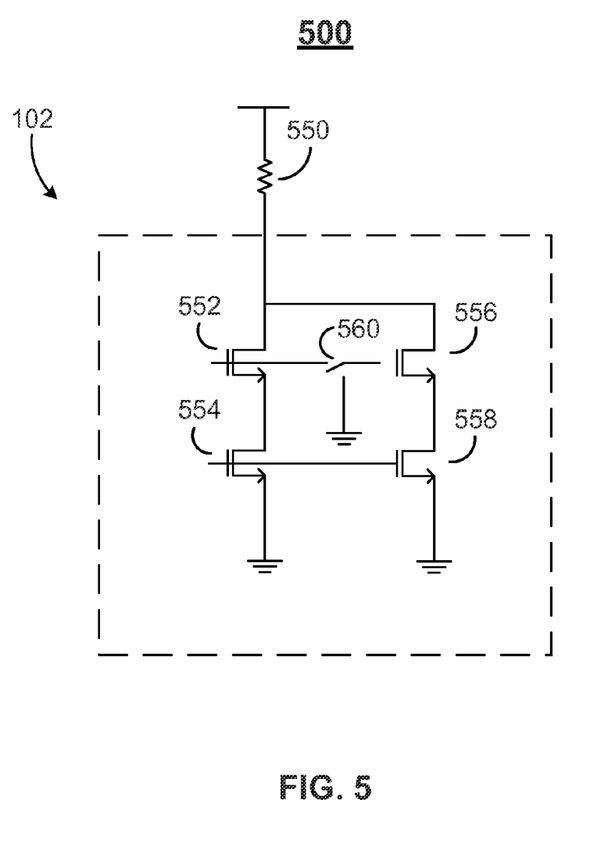
FIG. 5 shows an illustrative block diagram of a adjustable power amplifier, in accordance with an embodiment of the disclosure.
Figure 6:
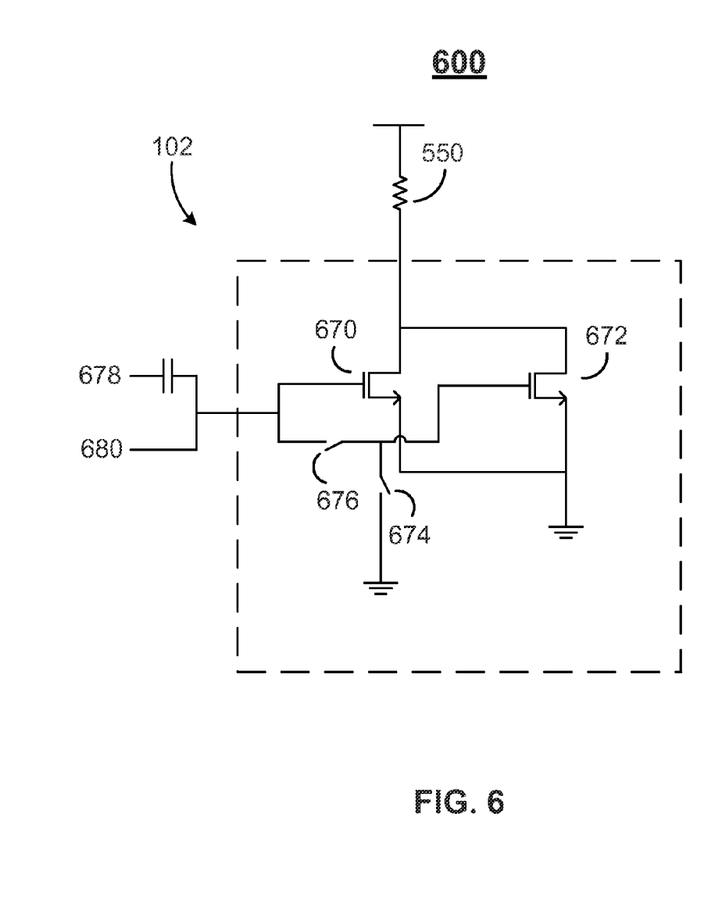
FIG. 6 shows an illustrative block diagram of an adjustable power amplifier, in accordance with an embodiment of the disclosure.

FIGS. 5 and 6 include diagrams 500 and 600 of a circuit that may be used for a power amplifier 102, in accordance with an illustrative embodiment of the present disclosure. In particular, the size of power amplifier 102 is adjustable such that different amounts of amplification are provided based on a desired mode of operation. The adjustable power amplifier 102 receives a signal from an input source and provides an amplified version of the signal to an output device such as balun 104. Power amplifier 102 is configured to adjust its size (i.e., small or large) based on an aspect of the input signal. As an example, computing device 800 may be configured to adjust the size of power amplifier 102.

In particular, diagram 500 includes a load 550, depicted here as a resistor outside of adjustable power amplifier 102. Load 550 corresponds to the load impedance of the variable impedance unit 112, which may or may not include a transformer such as balun 104 or a resistive load such as resistor 110. In particular, load 550 may correspond to the impedance of everything shown in diagrams 100a or 100b except for power amplifier 102. Thus, the impedance of load 550 may be dependent on the transformation ratio of a transformer such as balun 104, the resistance of resistor 110, and the overall impedance of variable impedance unit 112.

In diagram 500, adjustable power amplifier 102 includes four transistors 552, 554, 556 and 558, and a switch 560. Transistors 552-558 may be NMOS transistors, each with a source terminal (i.e., the upper terminal), a gate terminal (i.e., the left terminal), and a drain terminal (i.e., the lower terminal). A transistor such as any of transistors 552-558 may have electrical conduction between the source and drain terminals depending on the voltage at the gate terminal. As an example, if the gate voltage at a transistor is within a certain range (i.e., when the gate voltage is low or below some threshold voltage), the transistor is "off", such that no current flows between the source and drain terminals. Alternatively, when if the gate voltage is within another range (i.e., when the gate voltage is high or above some threshold voltage), the transistor is "on", such that some current flows between the source and drain terminals. Transistors 552-558 may have the same or different threshold voltages. As described herein, transistor 552-558 are three-terminal NMOS transistors. However, in general, transistors 552-558 may be any type of transistor, including PMOS transistors, CMOS transistors, BJT transistors, FET transistors, four terminal devices, or any combination thereof.

In diagram 500, transistors 552 and 554 are coupled such that the drain terminal of transistor 552 is coupled to the source terminal of transistor 554. This configuration of transistors 552 and 554 may be a cascode amplifier, which is a two-stage amplifier. Transistors 556 and 558 have a similar configuration and may be a second cascode amplifier. In a cascode amplifier, the input port (i.e., source terminal of transistor 552) and the output port (i.e., drain terminal of transistor 554) are electrically and physically separated, such that there is little feedback from the output to the input of the cascode. Therefore, cascode amplifiers may be desirable when stability is a desirable feature. In addition, the cascode amplifier configuration offers several other advantages, including high gain, high bandwidth, and high input impedance.

Depending on a desired mode of operation, which may be dependent on the input signal received from an input source (not shown), power amplifier 102 may adjust its size to be large or small. In diagram 500, the two cascode amplifiers (a first cascode including transistors 552 and 554, and a second cascode including transistors 556 and 558) are electrically coupled. In particular, the gate terminals of transistors 554 and 558 are coupled. In addition, switch 560 optionally couples the gate terminal of transistor 552 to the gate terminal of transistor 556, or to ground.

As an example, power amplifier 102 is a part of a wireless communication system that switches between using two standards (i.e., 802.11b and 802.11g). During operation in a first mode (i.e., 802.11b), computing device 800 may adjust the size of power amplifier 102 be a "small" device (i.e., activate the first cascode amplifier and inactivate the second cascode amplifier). In this case, the input signal to the power amplifier may have a low peak to average ratio. Therefore, the power amplifier 102 only needs to be linear up to a limited extent, and a smaller amplifier is able to meet the linearity specification. When a small device is desirable, switch 560 is coupled to ground, such that no current travels through transistors 556 and 558 and the second cascode amplifier is effectively off. In this case, only the first cascode amplifier is active, and the power amplifier of diagram 500 provides a smaller amount of amplification than if both cascode amplifiers (i.e., all four transistors) were active. By using only half the transistors in the device, power amplifier 102 consumes less power and is more efficient.

In contrast, computing device 800 may adjust the size of power amplifier 102 to be a "large" device (i.e., activate both cascode amplifiers) during operation in a second mode (i.e., 802.11g). In this case, the input signal to the power amplifier may have a high peak to average ratio. Therefore, the power amplifier 102 is required to be linear up to a higher extent, and a larger amplifier is necessary to meet the stricter linearity specification. In this case, switch 560 is coupled to the gate terminal of transistor 552, such that transistors 552 and 556 have the same gate voltage. Thus, the second cascode amplifier is active (i.e., current flows through transistors 556 and 558) when the first cascode amplifier is active (i.e., current flows through transistors 552 and 554). By activating all four transistors, the power amplifier of diagram 500 provides a large device that is able to meet the requirements associated with operation in the second mode. For example, operation in the second mode has a stricter linearity requirement, and additionally requires that the power amplifier 102 provide sufficient power. A small power amplifier 102 would be insufficient for use in the second mode because the small power amplifier would not be able to handle large peaks in the input signal (i.e., by becoming nonlinear or clipping the portions of the waveform with high amplitude). Thus, a large device is desirable for providing enough gain for signals with high peaks.

It is possible for the power amplifier 102 to keep both cascode amplifiers activated at all times, because a large device can handle input signals with both low and high peak to average ratios. However, activating both cascode amplifiers during operation in 802.11b mode is inefficient because a larger device consumes more power than a smaller device. Thus, use of a large device is wasteful when use of a smaller device would meet the requirements.

As depicted in diagram 500, switch 560 couples the gate terminal of transistor 556 to either the gate terminal of transistor 552 or ground. Alternatively, two switches may be used. For example, a first switch may be used to couple the gate terminals of transistors 552 and 556, and a second switch may be used to couple the gate terminal of transistor 556 to ground. In this case, when a small power amplifier is desired, the first switch may be open and the second switch may be closed. Alternatively, the first switch may be closed and the second switch may be open when a large power amplifier is desirable. Furthermore, both switches may be closed (i.e., effectively grounding both gate terminals of transistors 552 and 556) if no power amplification is desired.

Diagram 600 shows another example of an adjustable power amplifier 102. Diagram 600 includes the same load 550 as shown in diagram 500. Load 550 corresponds to the overall load impedance perceived by power amplifier 102 and may include a transformer such as balun 104, resistor 110, and/or a variable impedance unit 112. In diagram 600, adjustable power amplifier 102 includes two transistors 670 and 672, two switches 674 and 676, an input port 678, and a bias port 680. Each of transistors 670 and 672 may be considered as an amplifier portion of power amplifier 102. Depending on a desired operation mode, which is based on a feature of the input signal such as a peak to average ratio, transistor 672 may be activated or deactivated. In particular, when switch 676 is closed and switch 674 is open (i.e., which may be controlled by computing device 800), the gate terminals of transistors 670 and 672 are coupled such that both transistors are activated. Alternatively, when switch 676 is open and switch 674 is closed, transistor 672 is inactivated, effectively decreasing the size of power amplifier 102 by a factor of two. Furthermore, diagram 600 depicts input port 678 for receiving an input signal, which may cause current to flow through a capacitor and be added to current from a bias port 680. The combined signal drives the gate terminal of transistor 670 at all times, and the gate terminal of transistor 672 when switch 676 is closed.

As shown in diagrams 500 and 600, by allowing computing device 800 to configure its size based on the input signal, adjustable power amplifier 102 is able to meet the requirements for a high amplitude signal, while being efficient signals with low amplitudes. Adjustable power amplifier 102 can have both amplifier portions (i.e., cascode amplifiers in diagram 500 and transistors 670 and 672 in diagram 600) activated for operation as a full-sized device, or can have a single amplifier portion activated for operation as a half-sized device. The size of the power amplifier 102 may be further adjusted (i.e., by opening and closing switches) for any suitable fraction of a full-sized device by coupling additional transistors and switches in parallel, in series, or in any other suitable configuration.

The configuration of transistors 552-558 in diagram 500 and transistors 670-672 in diagram 600 are shown for illustrative purposes only, and one of ordinary skill in the art will understand that any suitable configuration for adjustable power amplifier 102 may be used. In particular, any number of transistors may be coupled over any number of switches. As an example, adjustable power amplifier 102 may include any number of transistors or cascode amplifiers, coupled with switches such that the size of the power amplifier 102 may be appropriately adjusted for efficient operation in any number of modes.

Figure 7:
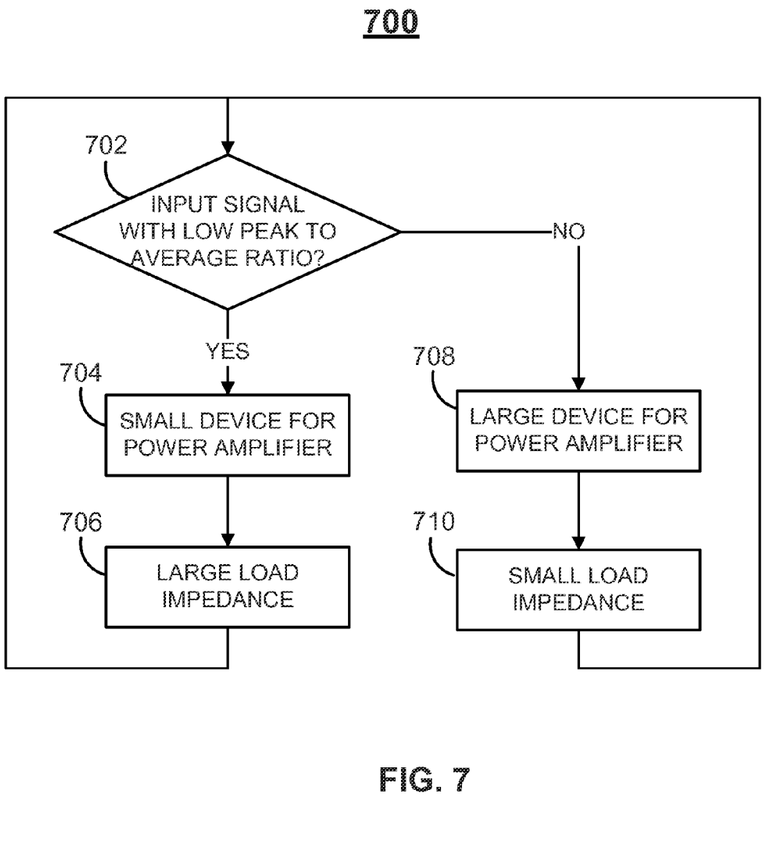
FIG. 7 shows a flow diagram of a method for configuring parameters of a multi-mode power amplification system, in accordance with an embodiment of the disclosure.

FIG. 7 shows a flow diagram of a process 700 for configuring parameters of a multi-mode power amplification system, in accordance with an embodiment of the disclosure. Process 700 is a high level illustration of a way that a computing device, such as computing device 800 described in relation to FIG. 8, may configure a power amplification system for operation in different modes. In particular, process 700 includes configuring a size of an adjustable power amplifier 102 and configuring a desired load impedance of a variable impedance unit 112, such that a single device may be used for efficient operation in multiple modes with different requirements and restrictions.

Process 700 includes determining whether an input signal has a low peak to average ratio (702). If so, a small device is configured for power amplifier 102 (704) and a large load impedance is configured for variable impedance unit 112 (706). Otherwise, a large device is configured for power amplifier 102 (708) and a small load impedance is configured for variable impedance unit 112 (710).

At 702, computing device 800 determines whether an input signal has a low peak to average ratio. Determining that the input signal has a low peak to average ratio may include receiving the input signal and identifying a peak amplitude and an average amplitude of the input signal waveform. For example, the peak and average amplitudes of the input signal may be identified over a specific time interval, such as the last second, minute, hour, or any other suitable time interval. In some embodiments, the time interval is dependent on the received data rate, the sampling frequency of the waveform, or the minimum amount of time required for the multi-modal power amplification system to change modes. The peak and/or average amplitudes may be dependent on a power of the waveform, or the square of the input signal. The peak to average ratio may be calculated by dividing the peak amplitude by the average amplitude. Computing device 800 may determine whether the input signal has a low peak to average ratio by comparing the calculated peak to average ratio to a predetermined threshold value.

If computing device 800 determines that an input signal has a low peak to average ratio at 702, computing device 800 configures a small device for power amplifier 102 at 704, and additionally configures a large load impedance for variable impedance unit 112 at 706. In particular, to configure a small device for power amplifier 102, computing device 800 may configure switches in power amplifier 102 such that half the power amplifier 102 becomes inactivated. For example, this may include grounding switch 560 in FIG. 5 or opening switch 676 and closing switch 674 in FIG. 6. To configure a large load impedance for variable impedance unit 112, computing device 800 may configure switches in variable impedance unit 112 such that an effective load impedance is large. For example, this may include opening switch 106 in FIG. 1A or opening switch 220 in FIG. 2A.

Alternatively, if computing device 800 determines that an input signal does not have a low peak to average ratio at 702, computing device 800 configures a large device for power amplifier 102 at 708, and additionally configures a small load impedance for variable impedance unit 112 at 710. In particular, to configure a large device for power amplifier 102, computing device 800 may configure switches in power amplifier 102 such that the full device of power amplifier 102 becomes activated. For example, this may include coupling the gate terminals of transistors 552 and 556 in FIG. 5 or closing switch 676 and opening switch 674 in FIG. 6. To configure a small load impedance for variable impedance unit 112, computing device 800 may configure switches in variable impedance unit 112 such that an effective load impedance is small. For example, this may include closing switch 106 in FIG. 1A or closing switch 220 in FIG. 2A.

In process 700, the order of 704 and 706 and the order of 708 and 710 are not important, and in general may also be performed in the opposite order or simultaneously. In addition, the calculation of the peak to average ratio of the input signal may be performed periodically to identify whether switching a mode is necessary. Furthermore, as described herein, computing device 800 determines a mode of operation based on a peak to average ratio of the input signal. However, determination of an operation mode may be performed based on any aspect or feature of the input signal. Alternatively, determination of an operation mode may be based on another parameter not derived from the input signal, such as an operation mode of another system or a user input.

Process 700 shows an illustrative flow diagram that uses a single predetermined threshold value for determining whether an input signal has a low peak to average ratio. One of ordinary skill in the art will understand that the systems and methods described herein are applicable to any number of threshold values. For example, the multi-modal power amplifier may be compatible with any number of modes, and selection of a mode may be dependent on whether the peak to average ratio of the input signal falls within some range of values. As depicted in FIG. 7, process 700 includes only two ranges of values, but the systems and methods described herein may be applied for any number of ranges for operation in multiple modes.

FIG. 8 is a block diagram of a computing device 800, such as any of the components of the systems of FIG. 1-2 or 4-6, for performing any of the processes described herein. Although the present disclosure is described as computing device 800 performing multi-modal power amplification, any one or more portions of computing device 800 may be used alone to perform any of the processes described herein. As an example, system 100a or 100b may be coupled to CPU 806, and it will be understood that CPU 806 may alone perform any of the processes described herein. Computing device 800 may be used to determine a desirable mode of operation, and configure the position of switches (i.e., opening or closing) based on the desired operational mode. Each of the components of these systems may be implemented on one or more computing devices 800. In certain aspects, a plurality of the components of these systems may be included within one computing device 800. In certain implementations, a component and a storage device may be implemented across several computing devices 800.

The computing device 800 comprises at least one communications interface unit, an input/output controller 810, system memory, and one or more data storage devices. The system memory includes at least one random access memory (RAM 802) and at least one read-only memory (ROM 804). All of these elements are in communication with a central processing unit (CPU 806) to facilitate the operation of the computing device 800. The computing device 800 may be configured in many different ways. For example, the computing device 800 may be a conventional standalone computer or alternatively, the functions of computing device 800 may be distributed across multiple computer systems and architectures. In FIG. 8, the computing device 800 is linked, via network or local network, to other servers or systems.

The computing device 800 may be configured in a distributed architecture, wherein databases and processors are housed in separate units or locations. Some units perform primary processing functions and contain at a minimum a general controller or a processor and a system memory. In distributed architecture implementations, each of these units may be attached via the communications interface unit 808 to a communications hub or port (not shown) that serves as a primary communication link with other servers, client or user computers and other related devices. The communications hub or port may have minimal processing capability itself, serving primarily as a communications router. A variety of communications protocols may be part of the system, including, but not limited to: Ethernet, SAP, SAS™, ATP, BLUETOOTH™, GSM and TCP/IP.

The CPU 806 comprises a processor, such as one or more conventional microprocessors and one or more supplementary co-processors such as math co-processors for offloading workload from the CPU 806. The CPU 806 is in communication with the communications interface unit 808 and the input/output controller 810, through which the CPU 806 communicates with other devices such as other servers, user terminals, or devices. The communications interface unit 808 and the input/output controller 810 may include multiple communication channels for simultaneous communication with, for example, other processors, servers or client terminals.

The CPU 806 is also in communication with the data storage device. The data storage device may comprise an appropriate combination of magnetic, optical or semiconductor memory, and may include, for example, RAM 802, ROM 804, flash drive, an optical disc such as a compact disc or a hard disk or drive. The CPU 806 and the data storage device each may be, for example, located entirely within a single computer or other computing device; or connected to each other by a communication medium, such as a USB port, serial port cable, a coaxial cable, an Ethernet cable, a telephone line, a radio frequency transceiver or other similar wireless or wired medium or combination of the foregoing. For example, the CPU 806 may be connected to the data storage device via the communications interface unit 808. The CPU 806 may be configured to perform one or more particular processing functions.

The data storage device may store, for example, (i) an operating system 812 for the computing device 800; (ii) one or more applications 814 (e.g., computer program code or a computer program product) adapted to direct the CPU 806 in accordance with the systems and methods described here, and particularly in accordance with the processes described in detail with regard to the CPU 806; or (iii) database(s) 816 adapted to store information that may be utilized to store information required by the program.

The operating system 812 and applications 814 may be stored, for example, in a compressed, an uncompiled and an encrypted format, and may include computer program code. The instructions of the program may be read into a main memory of the processor from a computer-readable medium other than the data storage device, such as from the ROM 804 or from the RAM 802. While execution of sequences of instructions in the program causes the CPU 806 to perform the process steps described herein, hard-wired circuitry may be used in place of, or in combination with, software instructions for implementation of the processes of the present disclosure. Thus, the systems and methods described are not limited to any specific combination of hardware and software.

Suitable computer program code may be provided for performing one or more functions in relation to performing multi-modal power amplification as described herein. The program also may include program elements such as an operating system 812, a database management system and "device drivers" that allow the processor to interface with computer peripheral devices (e.g., a video display, a keyboard, a computer mouse, etc.) via the input/output controller 810.

The term "computer-readable medium" as used herein refers to any non-transitory medium that provides or participates in providing instructions to the processor of the computing device 800 (or any other processor of a device described herein) for execution. Such a medium may take many forms, including but not limited to, non-volatile media and volatile media. Non-volatile media include, for example, optical, magnetic, or opto-magnetic disks, or integrated circuit memory, such as flash memory. Volatile media include dynamic random access memory (DRAM), which typically constitutes the main memory. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM or EEPROM (electronically erasable programmable read-only memory), a FLASH-EEPROM, any other memory chip or cartridge, or any other non-transitory medium from which a computer can read.

Various forms of computer readable media may be involved in carrying one or more sequences of one or more instructions to the CPU 806 (or any other processor of a device described herein) for execution. For example, the instructions may initially be borne on a magnetic disk of a remote computer (not shown). The remote computer can load the instructions into its dynamic memory and send the instructions over an Ethernet connection, cable line, or even telephone line using a modem. A communications device local to a computing device 800 (e.g., a server) can receive the data on the respective communications line and place the data on a system bus for the processor. The system bus carries the data to main memory, from which the processor retrieves and executes the instructions. The instructions received by main memory may optionally be stored in memory either before or after execution by the processor. In addition, instructions may be received via a communication port as electrical, electromagnetic or optical signals, which are exemplary forms of wireless communications or data streams that carry various types of information.

While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

What is claimed is:

1. A circuit for multi-modal power amplification, comprising:
    an adjustable power amplifier configured to amplify an input signal, wherein an amount of amplification is varied based on the input signal; and
    a variable impedance unit configured to:
        receive an amplified input signal from the adjustable power amplifier; and
        vary an amount of load impedance based on a peak to average ratio of the input signal, wherein the variable impedance load unit includes 1) a transformer, wherein the amount of load impedance is based on a transformation ratio of the transformer, or 2) an impedance device connected in parallel with a switch, wherein the impedance device includes at least one of a resistor, a capacitor, and an inductor.

2. The circuit of claim 1, wherein the adjustable power amplifier comprises a first amplifier connected in parallel with a second amplifier.

3. The circuit of claim 2, wherein the amount of amplification is varied by:
    coupling the first amplifier to the second amplifier, such that both amplifiers become active; and
    coupling the second amplifier to ground, such that the second amplifier becomes inactive.

4. The circuit of claim 3, wherein a determination to couple the second amplifier to the first amplifier or to ground is based on the input signal.

5. The circuit of claim 2, wherein the first and second amplifiers are cascode amplifiers.

6. The circuit of claim 1, wherein:
    a desired load impedance is determined based on the peak to average ratio of the input signal; and
    the switch is opened or closed based on the desired load impedance.

7. The circuit of claim 1, wherein the switch includes an LDMOS transistor.

8. The circuit of claim 1, wherein the adjustable power amplifier and variable load impedance unit are part of a wireless communication system and operate in accordance with a number of IEEE 802.11 standards.

9. A method for multi-modal power amplification, comprising:
    amplifying an input signal at an adjustable power amplifier, wherein an amount of amplification is varied based on the input signal;
    receiving an amplified input signal at a variable impedance unit, wherein an amount of load impedance at the variable impedance unit is varied based on a peak to average ratio of the input signal, wherein the variable impedance load unit includes 1) a transformer, wherein the amount of load impedance is based on a transformation ratio of the transformer, or 2) an impedance device connected in parallel with a switch, wherein the impedance device includes at least one of a resistor, a capacitor, and an inductor.

10. The method of claim 9, wherein the adjustable power amplifier comprises a first amplifier connected in parallel with a second amplifier.

11. The method of claim 10, further comprising varying the amount of amplification by:
    coupling the first amplifier to the second amplifier, such that both amplifiers become active; and
    coupling the second amplifier to ground, such that the second amplifier becomes inactive.

12. The method of claim 11, further comprising determining whether to couple the second amplifier to the first amplifier or to ground based on the input signal.

13. The method of claim 10, wherein the first and second amplifiers are cascode amplifiers.

14. The method of claim 9, further comprising:
    determining a desired load impedance based on the peak to average ratio of the input signal; and
    opening or closing the switch based on the desired load impedance.

15. The method of claim 9, wherein the switch includes an LDMOS transistor.

16. The method of claim 9, wherein the adjustable power amplifier and variable load impedance unit are part of a wireless communication system and operate in accordance with a number of IEEE 802.11 standards.

* * * * *